(12) United States Patent
Yamamoto et al.

(10) Patent No.: US 6,908,529 B2
(45) Date of Patent: Jun. 21, 2005

(54) PLASMA PROCESSING APPARATUS AND METHOD

(75) Inventors: Hideyuki Yamamoto, Kudamatsu (JP); Akira Kagoshima, Kudamatsu (JP); Shoji Ikuhara, Hikari (JP); Daisuke Shiraishi, Kudamatsu (JP); Junichi Tanaka, Tsuchiura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 297 days.

(21) Appl. No.: 10/087,771

(22) Filed: Mar. 5, 2002

(65) Prior Publication Data

US 2003/0170984 A1 Sep. 11, 2003

(51) Int. Cl.[7] .............................. H05H 1/00; C23F 1/00; C23C 16/00; H01L 21/00
(52) U.S. Cl. ............................ 156/345.24; 156/345.25; 118/712
(58) Field of Search .................. 156/345.24, 345.25; 118/712, 715

(56) References Cited

U.S. PATENT DOCUMENTS 5,658,423 A  8/1997  Angell et al.
5,980,767 A  * 11/1999  Koshimizu et al. ............ 216/60
6,245,190 B1  * 6/2001  Masuda et al. ......... 156/345.46

FOREIGN PATENT DOCUMENTS

| JP | 05259250 A | * 10/1993 | ........... H01L/21/66 |
| JP | A-10-125660 | 5/1998 | |
| JP | A-11-87323 | 11/1998 | |

* cited by examiner

Primary Examiner—Parviz Hassanzadeh
(74) Attorney, Agent, or Firm—Antonelli, Terry, Stout & Kraus, LLP

(57) ABSTRACT

A plasma processing system for processing a workpiece by using plasma generated in a chamber, includes a light transmissive member disposed in the chamber, the workpiece being disposed inside the light transmissive member; and a light receiving unit mounted on the chamber for receiving light inside the light transmissive member, wherein a state of processing the workpiece is detected by using data detected from light inside the light transmissive member before processing the workpiece and data detected from light inside the light transmissive member generated during processing the workpiece. A plasma processing method and system is provided which facilitates an operation of the system and executes a reliable processing.

14 Claims, 6 Drawing Sheets

FIG. 3A
FIG. 3B
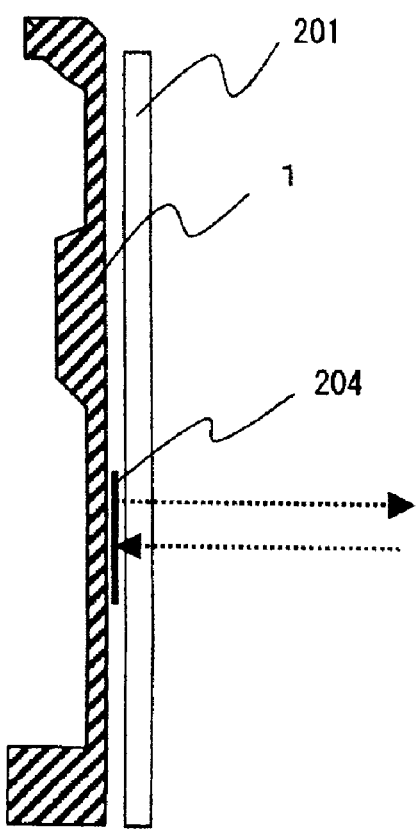
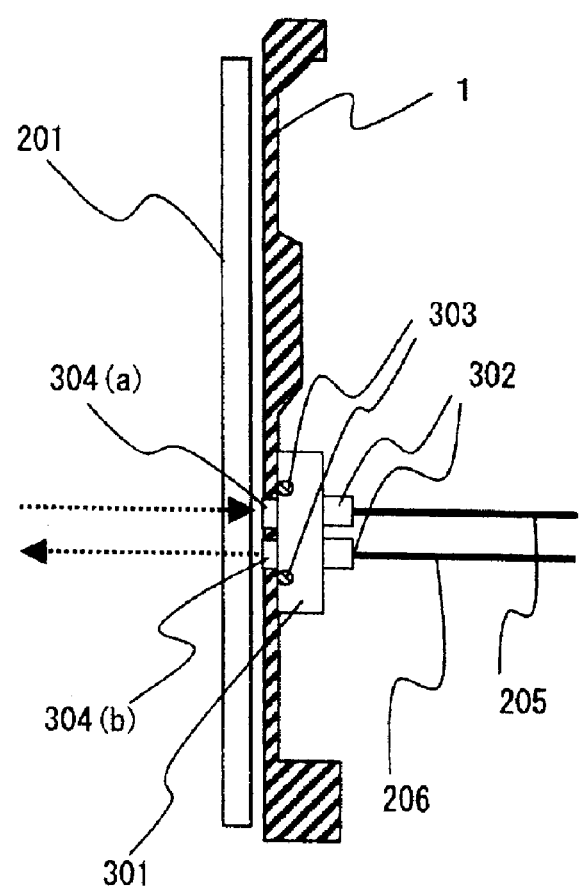

PLASMA PROCESSING APPARATUS AND METHOD

BACKGROUND OF THE INVENTION

1. Field of the Invention

The present invention relates to a plasma processing system having a plasma generating mechanism and to a plasma processing method, and more particularly to a plasma working system to be used as a semiconductor device manufacture system suitable for finely working semiconductor elements, an LCD manufacture system and the like, and to a plasma working method.

2. Description of the Related Art

Working semiconductor elements is becoming finer year after year, and the requirements of working size precision are becoming more severe. In a plasma processing system for physically and chemically working a semiconductor wafer by dissolving processing gas by plasma, reaction byproducts generated in the system are likely to be deposited and left on the inner wall of a plasma chamber, so that the wafer processing conditions are substantially changed in many cases. After a number of wafers are processed, the worked shapes of semiconductor elements change and reliable manufacture is impossible, irrespective of that the input conditions of the system are fixed.

In order to deal with this problem, deposits on the chamber inner wall are cleaned by plasma, or the temperature of the chamber inner wall is controlled in order to make deposits hard to be attached. These countermeasures are, however, insufficient for maintaining the wafer working conditions constant.

Since the wafer working conditions continue to gradually change, a worker is required to detect a change in the worked shape of a product before the change may pose some manufacture problem, to disassemble the plasma processing system to exchange components, and to wash the system with liquid or ultrasonic waves.

In addition to a deposited film on the chamber inner wall, various factors such as a processing system temperature cause such a change in the wafer working conditions. Conventionally, the processing conditions are maintained constant by detecting a change in the processing conditions of a plasma processing system and cleaning the system in response to the detected change, or by feeding back the detected results to the input of the system.

A means for monitoring a change in plasma processing conditions is disclosed, for example, in JP-A-10-125660. This publication discloses a method of predicting a system performance or diagnosing a plasma state from an equation between the plasma processing characteristics and electrical signals. An approximate equation representative of the relation between three electrical signals and plasma processing characteristic is obtained through multi regression analysis. Another example is disclosed in JP-A-11-87323. This publication discloses a method of monitoring a plasma processing system from a correlation signal of signals detected by a general detector system having a plurality of detectors and mounted on the plasma processing system. As a method of generating the correlation signal, an equation using ratios of six electrical signals is disclosed. Another disclosure is U.S. Pat. No. 5,658,423. This publication discloses a method of monitoring a system from a correlation signal generated from information including light and a number of signals supplied from a mass spectrometer. As a method of generating the correlation signal, main compositions are analyzed.

In the method disclosed in JP-A-10-125660, multi regression analysis is used to obtain the approximate equation representative of the relation between the processing characteristics and the three electrical signals which are obtained from a map formed by changing some input values among a number of processing condition values. Since the number of wafers from which the processing characteristics are measured is too large, it is practically difficult to obtain the equation. Moreover, if the plasma input values not taken into consideration change, the used model equation becomes invalid. If the model equation is required to incorporate the processing characteristics which depend on the internal conditions continuously changing with repetitive wafer processing and being hard to be measured, such as the internal conditions of a deposited film, a large number of experiments for obtaining the processing characteristics are required so that it is very difficult to realize this approach.

The method disclosed in JP-A-11-87323 is a generally used method which uses the correlation signal of a plurality of signals detected with detectors. A disclosed method of generating the correlation signal uses ratios of signals, which applies conventional techniques. A plasma processing system takes various conditions in accordance with many factors of changing the conditions. It is difficult to realize from this disclosure a specific system for correctly monitoring the various conditions of a plasma processing system.

U.S. Pat. No. 5,658,423 discloses a method of monitoring various plasma conditions by checking a change in the system conditions by analyzing main compositions from a large amount of monitored data. A plasma processing system processes wafers having various device structures under various conditions. It is difficult to realize from this disclosure an effective means for performing the disclosed method.

SUMMARY OF THE INVENTION

It is an object of the present invention to provide a plasma processing method and system capable of facilitating the practical operation and providing correct processing.

The above object can be achieved by a plasma processing system for processing a workpiece by using plasma generated in a chamber, comprising: a light transmissive member disposed in the chamber, the workpiece being disposed inside the light transmissive member; and light receiving means mounted on the chamber for receiving light inside the light transmissive member, wherein a state of processing the workpiece is detected by using data detected from light inside the light transmissive member before processing the workpiece and data detected from light inside the light transmissive member generated during processing the workpiece.

The above object can be achieved also by a plasma processing system for processing a workpiece by using plasma generated in a chamber, comprising: a light transmissive member disposed in the chamber, the workpiece being disposed inside the light transmissive member; and light receiving means mounted on the chamber for receiving light inside the light transmissive member, wherein an operation of the system is controlled by using data detected from light inside the light transmissive member before and after processing the workpiece.

The above object can be achieved also by a plasma processing system for processing a workpiece by using plasma generated in a chamber, comprising: a light transmissive member disposed in the chamber, the workpiece being disposed inside the light transmissive member; and light receiving means mounted on the chamber for receiving light inside the light transmissive member, wherein a state of generation of plasma is detected by using data detected from light inside the light transmissive member before processing the workpiece and data detected from light inside the light transmissive member generated during processing the workpiece.

The above object can be achieved also by a plasma processing system for processing a workpiece by using plasma generated in a chamber, comprising: a light transmissive member disposed in the chamber, the workpiece being disposed inside the light transmissive member; and light receiving means mounted on the chamber for receiving light inside the light transmissive member, wherein generation of plasma is controlled by using data detected from light inside the light transmissive member before and after processing the workpiece.

The above object can be achieved also by the plasma processing system further comprising light emitting means for emitting light having a predetermined output into the light transmissive member, the light emitting means emitting light having the predetermined output before or after processing the workpiece.

The above object can be achieved also by the plasma processing system further comprising reflection means mounted between the chamber and the light transmissive member for reflecting light emitted from the light emitting means toward the light receiving means.

The above object can be achieved also by the plasma processing system further comprising a mount unit for mounting the light emitting receiving means and light receiving means, the mount unit being mounted on the chamber.

The above object can be achieved by a plasma processing method of processing a workpiece by using plasma generated in a chamber, the workpiece being disposed inside a light transmissive member disposed in the chamber, comprising the steps of: detecting and storing first data of light inside the light transmissive member before processing the workpiece; detecting second data of light inside the light transmissive member generated during processing the workpiece; and detecting a state of processing the workpiece by using the second data added to the stored first data.

The above object can be achieved also by a plasma processing method of processing a workpiece through reaction with plasma generated in a chamber, the workpiece being disposed inside a light transmissive member disposed in the chamber, comprising the steps of: detecting and storing first data of light inside the light transmissive member before processing the workpiece; detecting second data of light inside the light transmissive member generated during processing the workpiece; and detecting the reaction by using the second data added to the stored first data.

The above object can be achieved also by a plasma processing method of processing a workpiece by using plasma generated in a chamber, the workpiece being disposed inside a light transmissive member disposed in the chamber, comprising the steps of: detecting and storing first data of light inside the light transmissive member before processing the workpiece; detecting second data of light inside the light transmissive member generated after processing the workpiece; and controlling an operation of the system by using the second data added to the stored first data.

The above object can be achieved also by a plasma processing method of processing a workpiece through reaction with plasma generated in a chamber, the workpiece being disposed inside a light transmissive member disposed in the chamber, comprising the steps of: detecting and storing first data of light inside the light transmissive member before processing the workpiece; detecting second data of light inside the light transmissive member generated after processing the workpiece; and diagnosing the system by comparing the second data with the stored first data.

Other objects, features and advantages of the invention will become apparent from the following description of the embodiments of the invention taken in conjunction with the accompanying drawings.

BRIEF DESCRIPTION OF THE DRAWINGS

FIGS. 3A and 3B are cross sectional views showing the detailed structures of a light receiving unit, a light emitting unit and a reflective member of the embodiment shown in FIG. 1.

DETAILED DESCRIPTION OF THE EMBODIMENTS

An embodiment of the invention will be described with reference to the accompanying drawings.

Figure 1:
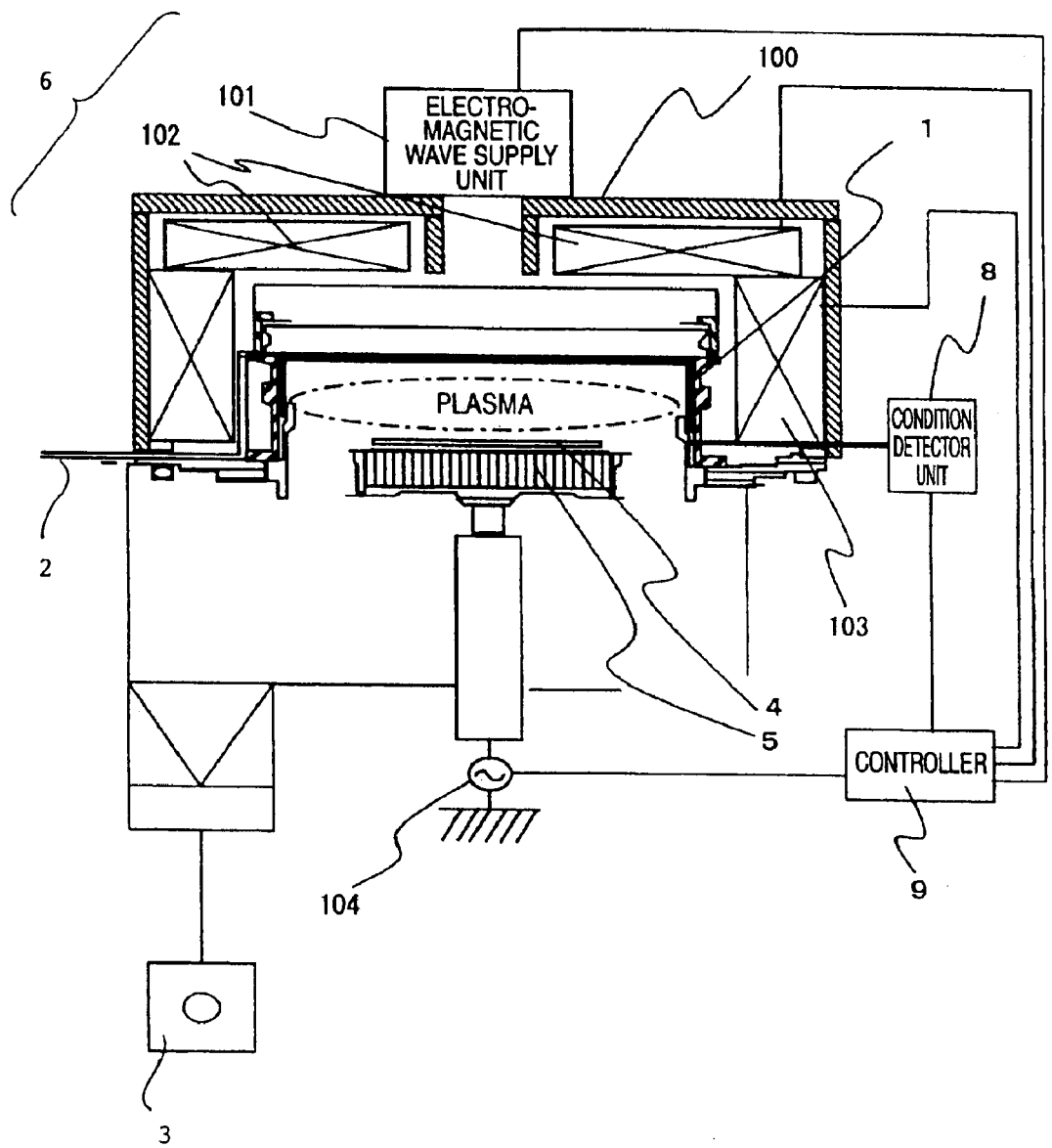
FIG. 1 is a vertical cross sectional view showing the outline of the structure of a plasma processing system according to a first embodiment of the invention.

FIG. 1 shows the first embodiment of the invention. FIG. 1 is a vertical cross sectional view showing the outline of the structure of a plasma processing system according to the first embodiment of the invention. Referring to FIG. 1, the main part 100 of the plasma processing system has a processing chamber 1 provided in which are a gas supply unit 2 for supplying processing gas and a gas exhaust unit 3 having a function of exhausting the processing gas and controlling the inner pressure of the processing chamber. A workpiece stage 5 for holding a workpiece 4 to be processed is also provided in the processing chamber 1. A plasma generating unit 6 is also provided in the processing chamber. The workpiece 4 is a wafer in a semiconductor device manufacture system, and it is an LCD in an LCD manufacture system.

The plasma generating unit 6 has an electromagnetic wave supply unit 101 for supplying and transmitting an electromagnetic wave (microwave) into the chamber 1, an antenna 102 for generating an electromagnetic field in the chamber, and a magnetron 103 for generating a magnetic field. A high frequency voltage is applied to the workpiece stage 5 from a high frequency voltage source 104 in order to move byproducts generated by the plasma toward the workpiece.

The plasma processing system has a system condition detector unit 8. For example, the condition detector unit 8 has a current or voltage detector, a current/voltage phase difference detector, a power travelling wave detector, a reflected wave detector, an impedance monitor and the like, respectively mounted on a power supply path to the plasma generating unit 6.

The condition detector unit 8 also has an analyzer unit for detecting light emitted from plasma in the processing chamber 1 generated by the plasma generating unit 6 and for generating data analyzed from the detected light. Although the condition detector unit 8 has preferably a detector capable of outputting a number of signals such as a spectroscope for outputting spectra of light at respective wavelengths, it may have a detector for detecting light of a single wavelength such as a monochrometer. Spectra of light output from the spectroscope correspond to a plurality of signals having light intensities at respective wavelengths.

The condition detector unit 8 may have other units different from those described above. For example, it may have a gas flow meter mounted on the gas supply unit and a mass spectrometer mounted on the processing chamber. The condition detector unit 8 may have, as will be later described, a means for externally introducing light such as phosphorous light and white light excited by a laser into the processing chamber, and for detecting a state change in the light passed through or reflected from the space in the plasma generating chamber. The condition detector unit 8 may have a means for externally applying an electrical signal and detecting its response, such as an active probe. The condition detector unit having these apparatuses outputs signals representative of the system conditions at a predetermined time interval or at preset sampling times.

In this embodiment, the system also has a controller 9 for controlling the operation of the system in accordance with the outputs of the condition detector unit 8. For example, the controller 9 turns on or off the power to the plasma generating unit 6 having a magnetron and the like for generating plasma to thereby generate electromagnetic waves and magnetic fields, and controls the plasma output level. The plasma output level may be controlled by another means. For example, in accordance with data obtained from light at a predetermined wavelength generated during processing a workpiece with plasma, the condition detector unit 8 may detect a reaction state in the chamber such as an increase/decrease of reaction amount during processing, speed, and plasma intensity, to thereby issue a command including a plasma generation command, a plasma generation stop command, a system start-up command and a system stop command and control the operation of the system.

Figure 2:
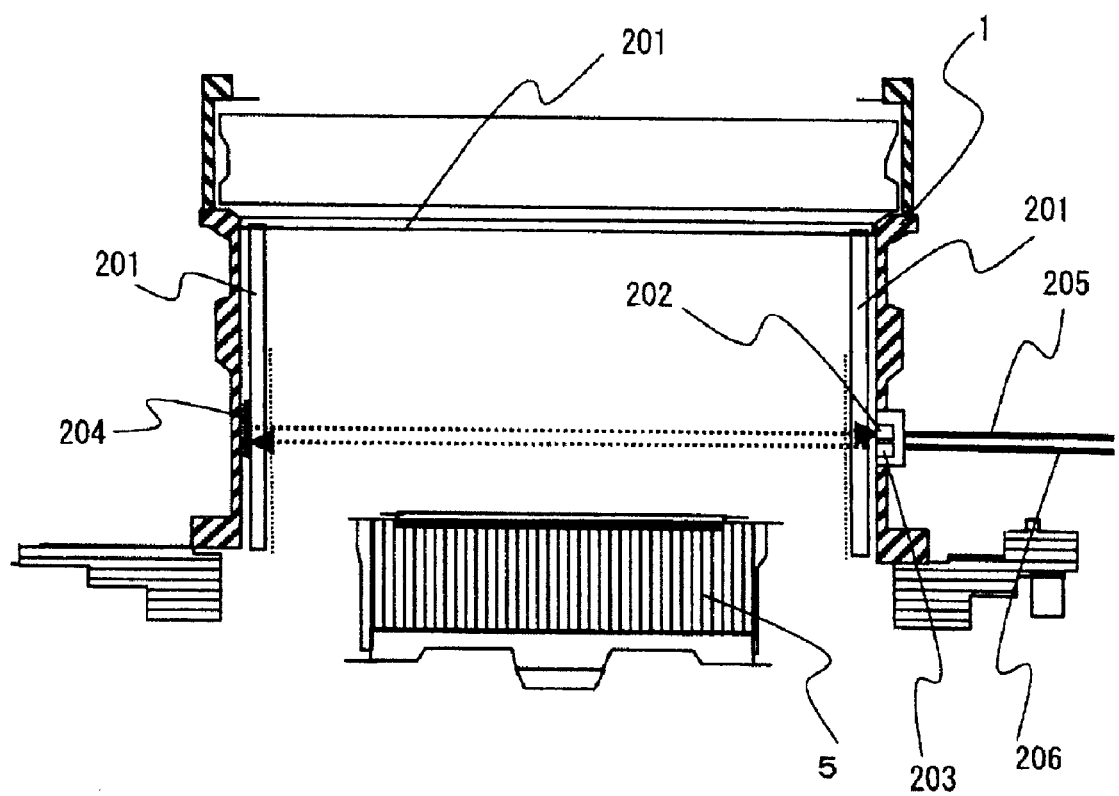
FIG. 2 is an enlarged view showing the periphery of a processing chamber of the embodiment shown in FIG. 1.

FIG. 2 an enlarged view showing the periphery of the processing chamber of the embodiment shown in FIG. 1. As shown in FIG. 2, a quartz glass cover 201 made of light transmissive material such as quartz glass is mounted on the processing chamber 1. The quartz glass cover 201 is mounted to cover the side or upper portion of the workpiece stage 5. This layout can suppress the inner wall of the chamber 1 from being attached with various byproducts to be formed by plasma inside the quartz glass cover 201 or chemical reaction byproducts, and from being etched by plasma or reaction byproducts.

In this embodiment, on the side wall of the chamber 1, a light emitting unit 203 for emitting light into the chamber and a light receiving unit 202 for receiving light in the chamber 1 (quartz glass cover 201) are mounted. In this embodiment, a reflective member 204 is mounted on the inner wall of the chamber 1 in order to reflect light emitted by the light emitting unit toward the light receiving unit.

The light receiving unit 202 mounted on the side wall of the chamber 1 is provided with a light receiving part for receiving light inside the quartz glass cover 201. The light received by the light receiving part is transmitted to a light receiving fiber 205. The light transmitted in the light reception fiber 205 is supplied to a light analyzer unit (to be described later) connected to the light receiving fiber. The light analyzer unit analyzes the light and detects necessary information.

The light emitting unit 203 is mounted on the side wall of the chamber 1 similar to the light receiving unit. Light emitted from an unrepresented light source is transmitted to a light supply fiber 206 and supplied from the light emitting unit 203 into the chamber 1. The chamber on the side of the light emitting unit 203 is provided with a light emitting part for emitting the transmitted light into the chamber via the quartz glass cover 201, as will be later described.

On the side wall of the chamber 1 on the side of the light receiving unit 202 and light emitting unit 203, a reflective member 204 is provided for receiving light in the chamber 1 (quartz glass cover 201) and reflecting it toward the light receiving unit 202. The reflective member 204 is mounted outside the quartz glass cover 201 in order to suppress byproducts generated by plasma and reaction byproducts from being attached and from etching the cover. In this embodiment, although the reflective member 204 is formed by a mirror surface body having a large surface reflectivity, the reflective member is not limited only thereto, but a member satisfying the requested performance specification may be selected. It is necessary to dispose the reflective member at such a position that reflected light can be received by the light receiving unit 202 at a sufficient intensity and amount. If this conditions are satisfied, the position is riot limited to the side wall on the side opposite to the light receiving unit 202 and light emitting unit 203 as in this embodiment, but it may be disposed inside the quartz glass cover 201 or at the upper inner surface of the chamber 1.

Light received by the light receiving unit 202 is transmitted to the light receiving fiber 205 and supplied to the analyzer unit, as described above. A known analyzer part of the analyzer unit analyzes received light at each frequency (wavelength). Light spectra at respective wavelengths contain information of reaction and substance generation. By evaluating the intensities and the like of the spectra, it becomes possible to detect the state of reaction and substance generation, such as a reaction amount and speed. For example, if spectra at some wavelengths have larger intensities and amount, it can be considered that reaction and substance corresponding to the wavelengths are large. Conversely, if the intensities of spectra become small, it can be considered that the corresponding reaction is small, or is terminated or stopped.

It is possible to detect the state of plasma and reaction by measuring light generated by plasma and reaction in the chamber. In this embodiment, light measured is transmitted through the quartz glass cover 201 so that the intensities and amount of the light are attenuated by transmission. Light is required to be analyzed by considering the influence of transmission in order to correctly detect the state of reaction and plasma in the chamber 1 (quartz glass cover 201). Since the quartz glass cover 201 is attached with byproducts generated by plasma and reaction or etched, light attenuation is influenced and changed. If substance is attached to the inner wall of the quartz glass cover 201, the intensities and amount of light transmitting therethrough are greatly attenuated and reduced. If this attenuation is not taken into consideration, it may be erroneously judged that inner light emission is reduced or the reaction is stopped or terminated.

The invention described in this embodiment provides a plasma processing system and method capable of evaluating inner reaction with good precision by considering the influence of a change in attenuation of light in a vessel when it transmits through a light transmissive member such as the quartz glass cover.

FIGS. 3A and 3B are cross sectional views showing the detailed structures of the light receiving unit 202, light emitting unit 203 and reflective member 204 of the embodiment shown in FIG. 1. FIG. 3A is a vertical cross sectional view showing the structure of the reflective member 204, and FIG. 3B is a vertical cross sectional view showing in an enlarged scale the detailed structures of the light receiving unit 202 and light emitting unit 203.

In this embodiment, as shown in FIG. 3B the light receiving unit 202 and light emitting unit 203 are disposed near each other on the side wall of the processing chamber 1. In this embodiment, the light receiving unit 202 and light emitting unit 203 are mounted on a same mount member 301. As described earlier, the light receiving unit 202 and light emitting unit 203 are mounted on the inner wall of the chamber with both the optical paths being set generally parallel. The light receiving fiber 205 and light supply fiber 206 are mounted generally in parallel to the mount member 301 via field through members 302. When the mount member 301 with the light receiving unit 202 and light emitting unit 203 is mounted on the side wall of the chamber 1, an O-ring 303 is used in order to seal the interface between the mount member 301 and the side wall of the chamber 1. Sealing both the light receiving unit and light emitting unit can therefore be established by one O-ring 303. It becomes easy to mount the light receiving and emitting units. The number of chamber fabrication steps can be reduced and the system cost can be lowered.

Quartz glass end members 304(a) and 304(b) made of light transmissive material such as quartz glass are disposed between the input/output ports of the fibers 205 and 206 and the outer surface of the quartz glass cover 201. These end members 304(a) and 304(b) are coupled to the front ends of the fibers 205 and 206 and mounted on the mount member 301, and inserted into through holes formed through the side wall of the chamber 1 on which the mount member 301 is attached. These end members transmit light between the front ends of the fibers and the quartz glass cover 201. The O-ring 303 is also used by sealing the through holes.

In this embodiment, on the side wall of the chamber 1, a view port unit is mounted which includes the fibers 205 and 206, mount member 301, field through member 302, and quartz glass end members 304. By mounting the view port unit on the chamber 1, the manufacture processes of mounting, working and the like can be simplified and the manufacture cost can be reduced.

Figure 4:
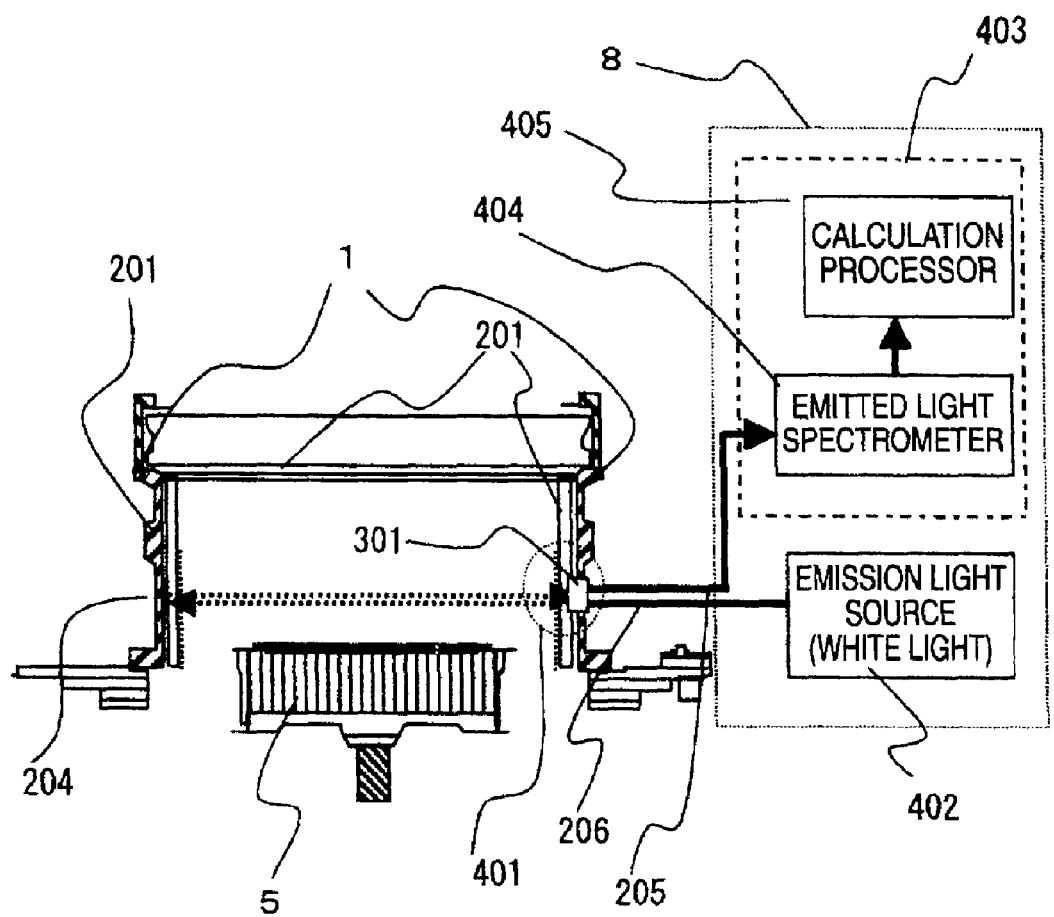
FIG. 4 is a diagram showing the outline of the structure of a processing system including the plasma processing system of the embodiment shown in FIG. 1.

FIG. 4 is a diagram showing the outline of the structure of a processing system including the plasma processing system of the embodiment shown in FIG. 1. Referring to FIG. 4, light transmitted through the light supply fiber 206 from a white light source 402 is emitted into the fiber chamber 1 via the quartz glass end member 304(b) of the view port unit 401 mounted on the chamber of the system main body. The emitted light transmits through the quartz glass cover 201 twice, and thereafter is reflected by the reflective member 204 mounted on the inner wall of the chamber and transmitted to the light receiving unit 202 of the view port unit 401.

The light reflected by the reflective member 204 transmits through the quartz glass cover 201 twice and thereafter is received by the light receiving unit 202 via the quartz glass end member 304(a). The light is then transmitted in the light receiving fiber 205 and supplied to the analyzer unit 403 connected to the light receiving fiber 205. The analyzer unit 403 analyzes the supplied light into spectra at respective frequencies (wavelengths) by using an emission light spectrometer 404. The analyzed spectra intensities and amount and the characteristics are transmitted to a calculator (calculation processor) 405 which calculates light information. The calculated light information is stored in an unrepresented memory to be used for controlling the operation of the system at a later time. In this embodiment, although the analyzer unit including the emitted light spectrometer 404 and calculation processor 405 and the while light source 402 constitute the condition detector unit 8, they may constitute the controller 9.

As described earlier, light generated in the chamber 1 during processing a workpiece by plasma contains light emitted by various chemical reactions and byproduct generation reactions in plasma. The analyzer unit 403 analyzes the transmitted and received light in the chamber into spectra at respective wavelengths (frequencies) and detects the intensities and amount of the spectra.

Detected light data such as spectrum intensities is stored to be compared each other. For example, by utilizing a change in time sequential data of a spectrum at a particular wavelength, reaction information can be obtained such as a start and end and a state of reaction at the wavelength.

In this embodiment, the analyzer unit 403 detects the reaction information, and by suppressing the influence of attenuation of light transmitting through the light transmissive member such as the quartz glass cover 201 and the influence of a change in the attenuation during repetitive plasma processing upon the reaction state in the chamber, a precision of detecting a reaction is improved.

Figure 5:
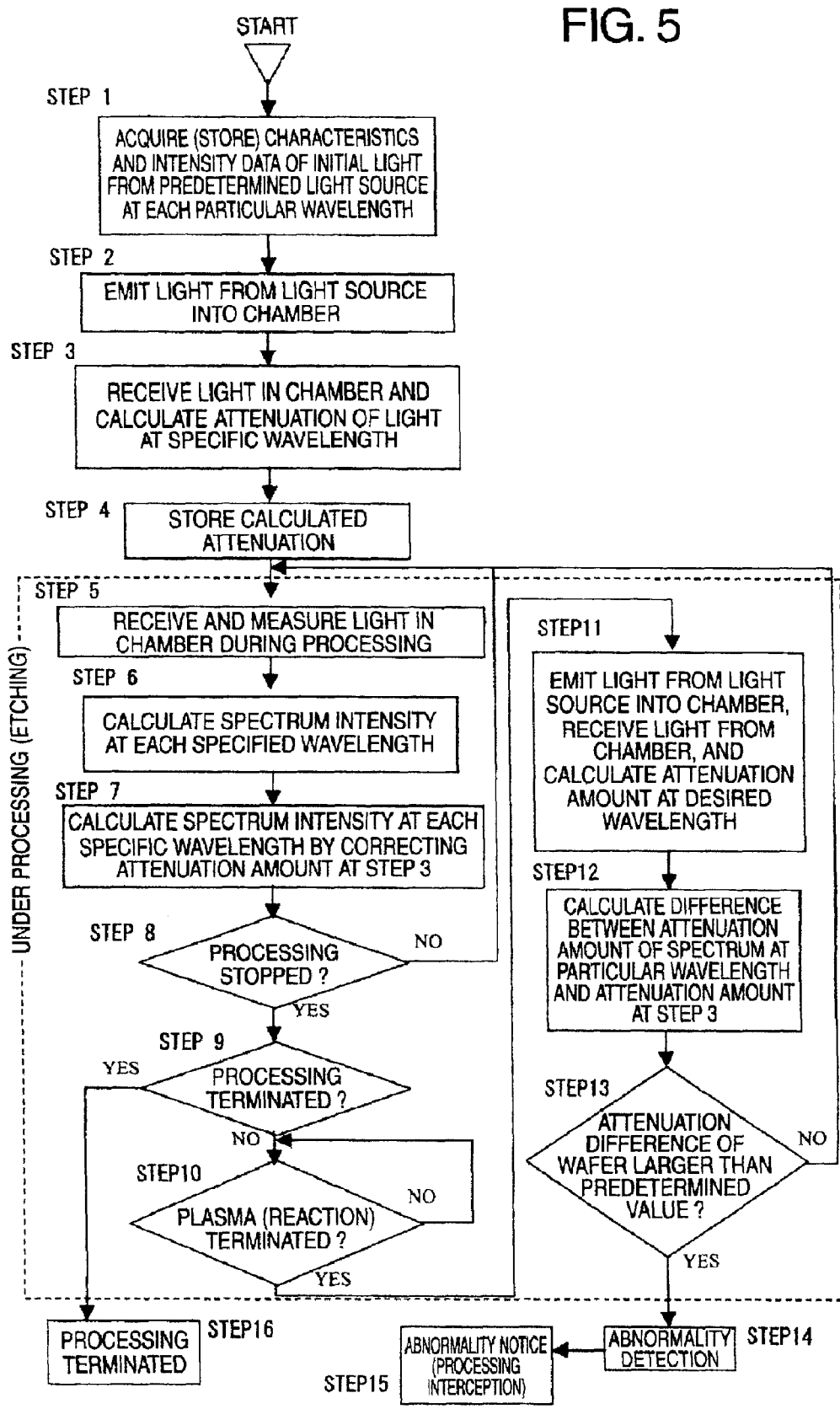
FIG. 5 is a flow chart illustrating a workpiece processing operation including a detection process of reaction information of the plasma processing system of the embodiment shown in FIG. 1.

With reference to FIG. 5, the operation of the plasma processing system of the embodiment shown in FIG. 1 will be described. FIG. 5 is a flow chart illustrating an operation of processing a workpiece including a process of detecting reaction information in the plasma processing system of the embodiment shown in FIG. 1. In this embodiment, after or before a workpiece is subjected to a desired process by using plasma, a predetermined light beam is introduced from the light emitting unit 203 into the inner space of the quartz cover 201 in the chamber 1. By using data obtained from the emitted and received light, a reaction during the processing is detected or the processing is controlled.

In FIG. 5, at Step 1 information of a predetermined light beam to be emitted into the chamber is acquired beforehand. This light information such as emission intensities and amount at respective wavelengths is stored before processing, and is utilized at a later step to properly control the information of received and analyzed light. In this embodiment, although white light is used in order to emit light having a number of wavelengths, light having one or more wavelengths to be detected may also be used.

At Step 2 light from the light source 402 transmitted in the light supply fiber 206 is emitted from the light emitting unit 203 into the chamber 1. As described earlier, the emitted light transmits through the quartz glass cover 201 and transmits in the inner space of the chamber in the quartz glass cover 201. At this stage, since the processing is not performed, plasma is not generated in the space of the chamber. Light emitted into the space of the chamber transmits the quartz glass cover 201 again, and reaches and is reflected by the reflective member 204 disposed on the inner wall of the chamber. At least a portion of the reflected light transmits again through the quartz glass cover 201, the space of the chamber, and the quartz glass cover 201, and thereafter reaches and is received by the light receiving unit 202. The received light is transmitted via the fiber 205 to the analyzer unit 402 whereat it is analyzed into spectra at respective wavelengths.

At Step 3 the intensities and amount of the analyzed spectra at respective wavelengths are calculated by the calculator 405. By referring to and comparing with the data of emitted light acquired and stored at Step 1, it is possible to detect an attenuation amount of light emitted into the chamber and transmitting through the quartz glass cover 201 and the like. For example, in this embodiment, light emitted into the chamber 1 transmits through the quartz glass cover 201 four times or at four positions until the light is reflected by the reflective member 204 and received by the light receiving unit 202.

If the positions and shapes of the areas of the quartz glass cover 201 through which the light transmits can be known in advance, in accordance with a difference between the light data obtained at Step 1 and the light data obtained at Step 3, the attenuation amount of the light transmitting through the quartz glass cover 202, e.g., the attenuation amount of light transmitting through the quartz glass cover 201 just inside the light receiving unit 202, can be calculated. If the thicknesses of the quartz glass cover 201 through which light at a predetermined wavelength transmits are the same at the four positions, the attenuation amount of light transmitting at one position is a quarter of the total attenuation amount. This attenuation amount can be used as the attenuation amount of light transmitting through the quartz glass cover 201 just inside the light receiving unit 202. If the material of the quartz glass cover 201 is homogeneous, the attenuation amount of light transmitting through the quartz glass cover 201 just inside the light receiving unit 202 can be calculated from the attenuation amount per unit quartz glass thickness calculated from the total quartz glass thickness at the four positions through which white light transmits.

At Step 3, in addition to the attenuation amount, a fiber transmission loss and a mirror surface body reflection loss are also calculated.

At Step 4 the attenuation amount calculated at Step 3 is stored in an unrepresented memory. This memory may be built in the condition detector unit 8 or controller 9 of the system, or may be an external memory of the system.

The above-described information is acquired before a workpiece is processed or before plasma is generated for processing the workpiece, and thereafter the workpiece processing starts. In this embodiment, an etching process will be used by way of example. At Step 5 plasma is generated and during the etching process, light in the chamber including light emitted from plasma in the chamber 1 (quartz glass cover 201) is received by the light receiving unit 202. At Step 6 the received light in the chamber 1 (quartz glass cover 201) is transmitted to the analyzer unit 403 to analyze the light in the chamber during the etching process, in the manner described earlier. The calculator 405 of the analyzer unit 403 calculates information such as the intensities and amount of spectra of the transmitted light.

The light received by the light receiving unit 202 was attenuated by deposits attached on the surface of the quartz glass cover 201, or attenuated through scattering at the quartz glass surface etched and degraded by byproducts generated by plasma and reaction. Therefore, the information of light transmitted from the chamber 1 may differ greatly from the information obtained by analyzing the spectra of light existing in the chamber and formed by plasma and reaction.

The transmission factor and thickness of the quartz glass cover 201 change because plasma and generated reaction byproducts are attached or etch the cover during repetitive processing, so that the light attenuation amount changes. From this reason, at Step 7 the light information obtained at Step 6 is adjusted by referring to the light attenuation calculated and stored at Steps 3 and 4. For example, the intensity of a light spectrum at each wavelength obtained at Step 6 is added to the attenuation amount at the same wavelength. It can be considered that this addition data is information of light existing in the chamber 1 not subjected to the attenuation when the light transmits through the quartz glass cover 201. By using this data, the reaction state in the chamber 1 is judged. Namely, by utilizing the information obtained at Steps 3 and 4, the reaction state in the chamber of the system during processing by plasma can be detected more precisely.

At Step 8 the reaction state in the chamber 1 of the system is judged from the light information obtained at Step 7. It is judged from the reaction state whether the processing is stopped or continued. If it is judged that the processing is continued, for example, if it is judged that the reaction at a wavelength in the chamber 1 is continuing because the intensity of the spectrum at the wavelength detected at Step 7 is larger than a predetermined value, then the controller 9 issues a command to the plasma processing system to continue the presently performed processing, to thereafter return to Step 5. If it is judged that the processing is stopped, for example, if it is judged that the intensity of the spectrum at a specific wavelength detected at Step 7 is smaller than a predetermined magnitude, then it is judged that the specific reaction in the chamber 1 corresponding to the wavelength is terminated or nearly terminated. The controller 9 issues a command to the plasma processing system to stop the presently performed processing, to thereafter advance Step 9. At Step 9 it is judged whether the processing by the system is terminated or continued. If it is judged that the processing is to be terminated, the processing is terminated at Step 16. If it is judged that the processing continues, the flow advances to Step 10 whereat the workpiece continues to be processed or another workpiece is processed.

In response to the processing stop at Step 8, at Step 10 light in the chamber is detected at the light receiving unit 202 to judge whether plasma or the reaction was stopped or became sufficiently small. In this case, plasma or reaction is detected until light emission of plasma in the chamber is lost or becomes negligibly small. When light emission becomes negligibly small or is lost, it is judged that the reaction in the chamber was stopped or became sufficiently small. If it is judged that the reaction was stopped, the flow advances to Step 11 to perform succeeding Steps.

After it is judged that the reaction was stopped or became sufficiently small and that the attenuation amount of light transmitting through the quartz glass cover 201 can be detected by using a correction unit including the view port unit 401 and reflective member 204 of the embodiment, at Step 11 light of the light source 402 is emitted from the light emitting unit 202 into the chamber 1 similar to Step 2. The emitted light transmits through the quartz glass cover 201 and the inner space of the chamber 201 and reaches the reflective member 204. The light reflected by the reflective member again transmits through the quartz glass cover 201 and the inner space of the chamber 201 and reaches the light receiving unit 202. This light is transmitted via the quartz glass end member 304(a) and light receiving fiber 205 to the analyzer unit 403. The light is analyzed into spectra to calculate the intensity at a predetermined wavelength. Similar to Step 3, by referring to the data stored at Step 1 and comparing with the data at Step 11, the attenuation amount of the light in the chamber 1 transmitting through the quartz glass cover 201 and the like is detected.

Before and after one etching process, the attenuation amount of light transmitting through the quartz glass cover 201 and the like in the container 1 is detected. The attenuation amount calculated at Step 11 may be stored in the memory similar to Steps 1 and 4.

Thereafter, at Step 13 the calculator 405 calculates a difference between the attenuation amounts before and after the etching process, i.e., the attenuation amount calculated and stored at Steps 3 and 4 and the attenuation amount calculated at Step 12. The difference between the attenuation amounts is compared with a predetermined value. If the difference is equal to or smaller than the predetermined value, the flow returns to Step 5 to perform the next processing. If the difference is larger than the predetermined value, it is judged that the light attenuation amount is large so that a detection error of the processing using light in the chamber 1 and a detection error of a reaction state become large, or that the amount of deposits on the surface of the quartz glass cover 201 and the etch amount of the surface become large. It is judged in each case that the system cannot be operated normally, and the flow advances to Step 14 whereat a system operation procedure when an abnormal state is detected is performed. In some case, at Step 15 an abnormal state detection is notified.

Figure 6A:
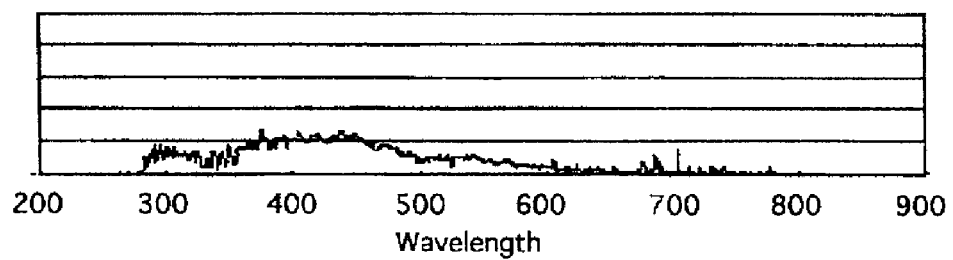
FIGS. 6A, 6B and 6C are graphs showing spectra of light in a chamber obtained by an analyzer mounted on the plasma processing system of the embodiment shown in FIG. 1.
Figure 6B:
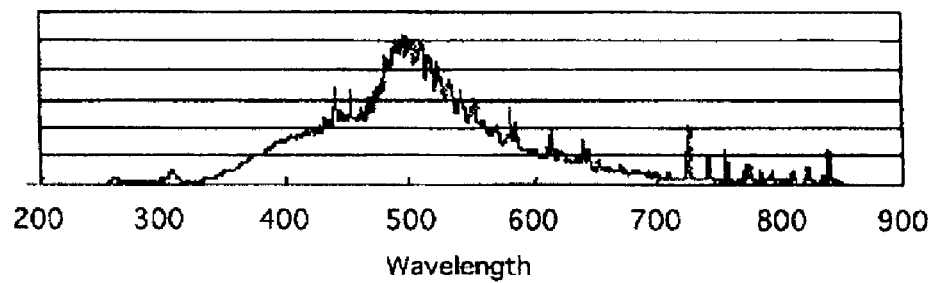
Figure 6C:
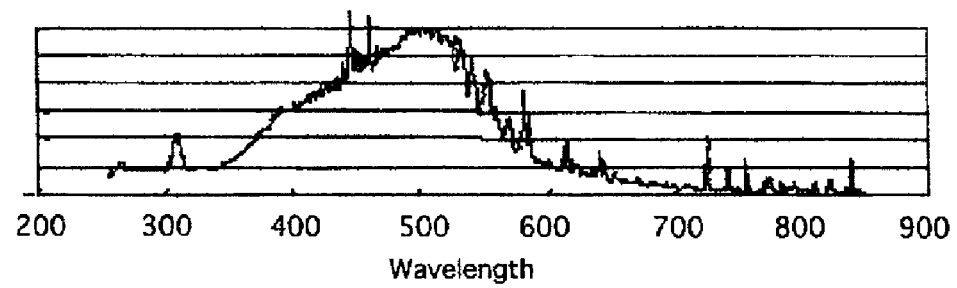

FIGS. 6A to 6C show the distributions of spectra of light in the chamber obtained by the analyzer unit 403. FIGS. 6A to 6C are graphs showing spectra of light in the chamber obtained by the analyzer unit of the plasma processing system of the embodiment shown in FIG. 1. FIG. 6A shows the distribution of spectra of light received at the light receiving unit 202 when a predetermined light beam is emitted from the light emitting unit 203 into the chamber 1.

Light emitted from the light emitting unit 203 into the chamber 1 is reflected by the reflective member 204 and received by the light receiving unit 202. The received light transmitted through the quartz glass cover 201 four times or at four positions so that the intensity of the light is attenuated. The graph shown in FIG. 6A shows the attenuation amount of light at each wavelength transmitted through the quartz glass cover 201. Namely, this graph shows the light data obtained at Step 3 or Step 11.

FIG. 6B shows the distribution of spectra of light obtained through analysis by the analyzer unit 403, the light received by the light receiving unit 202 during plasma processing. Namely, the graph shows light data at Step 6. As described earlier, light reaching from the chamber 1 to the light receiving unit 202 was attenuated by quartz glass of the quartz glass cover 201 and by deposits attached to the surface of the quartz glass cover 201. During the plasma processing, plasma and reaction etch the surface of the plasma glass cover 201. Since etching the quartz glass and attachment of deposits on the surface change with each processing, the attenuation amount of light transmitting through the quartz glass cover 201 changes with each processing and during each processing. The spectrum distribution shown in FIG. 6B is obtained from light attenuated by these factors, and is different from the spectrum distribution of light existing in the chamber 1.

From this reason, Step 7 corrects the spectrum distribution shown in FIG. 6B by using the light attenuation data shown in FIG. 6A, so that the data of light which is approximately the light existing in the chamber 1 can be obtained. This data is shown in FIG. 6C. By using such data, the state of the plasma processing can be detected more precisely, the processing efficiency can be improved, and the precision of the plasma processing can be improved. Accordingly, the manufacture yield and precision can be improved and the manufacture cost can be lowered.

In the embodiment, semiconductor such as silicon and its compound is used as the workpiece and etched by using plasma. The structure described in the embodiment is applicable to another process using plasma, such as processing a source material of a liquid crystal display, with similar advantageous effects.

As described so far, according to the invention, a plasma processing system and method capable of facilitating the operation and reliably performing processing can be provided.

It should be further understood by those skilled in the art that the foregoing description has been made on embodiments of the invention and that various changes and modifications may be made in the invention without departing from the spirit of the invention and scope of the appended claims.

What is claimed is:

1. A plasma processing apparatus for processing a workpiece using plasma generated in a cylindrical chamber, comprising:

a light transmissive member disposed in the chamber, the workpiece being disposed inside of the light transmissive member; and a member mounted on a side wall of the chamber covering at least one hole disposed in the side wall and having mounted thereon a light emitting device which emits predetermined light into the chamber while the plasma is not generated and a light receiving device which receives the predetermined light reflected inside the chamber and transmitted through the light transmissive member;

wherein a state of processing of the workpiece is detected using data obtained from the predetermined light received by the light receiving device through the light transmissive member and data obtained from light inside the chamber which is received by the light receiving device through the light transmissive member during processing of the workpiece.

2. A plasma processing apparatus according to claim 1, wherein the state of processing of the workpiece is detected by correcting the data obtained from the light inside the chamber during processing of the workpiece using the data obtained from the predetermined light.

3. A plasma processing apparatus according to claim 2, wherein the state of processing of the workpiece is adjusted using the data obtained from the predetermined light and the data obtained from the light inside the chamber.

4. A plasma processing apparatus according to claim 1, wherein the state of processing of the workpiece is adjusted using the data obtained from the predetermined light and the data obtained from the light inside the chamber.

5. A plasma processing apparatus according to claim 1, wherein an abnormal state of processing of the workpiece is detected using the data obtained from the predetermined light.

6. A plasma processing apparatus for processing a workpiece using plasma generated In a cylindrical chamber, comprising:

a light transmissive member disposed in the chamber, the workpiece being disposed inside of the light transmissive member;

a member mounted on a side wall of the chamber covering at least one hole disposed in the side wall and having mounted thereon a light emitting device which emits predetermined light into the chamber while the plasma is not generated and a light receiving device which receives the predetermined light reflected inside the chamber and transmitted through the light transmissive member so that an optical path of the predetermined light emitted from the light emitting device and an optical path of the predetermined light reflected inside the chamber and received by the light receiving device are substantially in parallel;

wherein a state of processing of the workpiece is detected using data obtained from the predetermined light received by the light receiving device through the light transmissive member and data obtained from light inside the chamber which is received by the light receiving device through the light transmissive member during processing of the workpiece.

7. A plasma processing apparatus according to claim 6, wherein the light emitting device emits the predetermined light introduced through a fiber into the chamber.

8. A plasma processing apparatus according to claim 7, wherein the state of processing of the workpiece is adjusted using the data obtained from the predetermined light and the data obtained from the light inside the chamber.

9. A plasma processing apparatus according to claim 6, wherein the member having the light emitting device and the light receiving device mounted thereon is mounted on the side wall of the chamber so that a front end of the light receiving device is provided at the at least one hole in the side wall.

10. A plasma processing apparatus according to claim 9, wherein the state of processing of the workpiece is adjusted using the data obtained from the predetermined light and the data obtained from the light inside the chamber.

11. A plasma processing apparatus according to claim 9, wherein an abnormal state of processing the workpiece is detected using the data detected from the predetermined light.

12. A plasma processing apparatus according to claim 9, wherein an abnormal state of processing the workpiece is detected using the data detected from the predetermined light.

13. A plasma processing apparatus according to claim 6, wherein the state of processing of the workpiece is adjusted using the data obtained from the predetermined light and the data obtained from the light inside the chamber.

14. A plasma processing apparatus according to claim 6, wherein an abnormal state of processing the workpiece is detected using the data detected from the predetermined light.

* * * * *